(12) United States Patent
Chang et al.

(10) Patent No.: US 11,943,908 B2
(45) Date of Patent: Mar. 26, 2024

(54) METHOD, STRUCTURES AND DEVICES FOR INTRA-CONNECTION STRUCTURES

(71) Applicant: Taiwan Semiconductor Manufacturing Company, Ltd., Hsinchu (TW)

(72) Inventors: Feng-Ming Chang, Zhubei (TW); Kuo-Hsiu Hsu, Zhongli (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 132 days.

(21) Appl. No.: 17/092,768

(22) Filed: Nov. 9, 2020

(65) Prior Publication Data

US 2021/0057422 A1   Feb. 25, 2021

Related U.S. Application Data

(60) Continuation of application No. 16/397,353, filed on Apr. 29, 2019, now Pat. No. 10,833,090, which is a
(Continued)

(51) Int. Cl.
*H10B 10/00* (2023.01)
*H01L 21/768* (2006.01)
(Continued)

(52) U.S. Cl.
CPC ....... *H10B 10/12* (2023.02); *H01L 21/76895* (2013.01); *H01L 21/76897* (2013.01);
(Continued)

(58) Field of Classification Search
CPC . H01L 27/0207; H01L 27/1052; H01L 27/11; H01L 27/1104; H01L 29/4232;
(Continued)

(56) References Cited

U.S. PATENT DOCUMENTS

| 4,951,112 A | 8/1990 | Choi et al. |
| 5,899,742 A | 5/1999 | Sun |

(Continued)

FOREIGN PATENT DOCUMENTS

| JP | 2007103862 A | 4/2007 |
| JP | 2007109973 A | 4/2007 |

(Continued)

OTHER PUBLICATIONS

Korean Office Action; Application No. 10-2014-0163687; dated Aug. 21, 2015.
(Continued)

*Primary Examiner* — Andres Munoz
(74) *Attorney, Agent, or Firm* — Slater Matsil, LLP

(57) ABSTRACT

Systems and methods are provided for forming an intra-connection structure. A first gate structure and a first source/drain region adjacent to the first gate structure is formed on a substrate. A first dielectric material is disposed on the first source/drain region. A spacer material is formed on the first gate structure. The first dielectric material is removed to expose at least part of the first source/drain region. At least part of the spacer material is removed to expose at least part of the first gate structure. A first conductive material is formed between the first gate structure and the first source/drain region to electrically connect the first source/drain region and the first gate structure.

20 Claims, 16 Drawing Sheets

Related U.S. Application Data continuation of application No. 15/658,660, filed on Jul. 25, 2017, now Pat. No. 10,276,580, which is a division of application No. 14/278,375, filed on May 15, 2014, now Pat. No. 9,721,956.

(51) Int. Cl.
*H01L 23/485* (2006.01)
*H01L 27/02* (2006.01)
*H10B 99/00* (2023.01)

(52) U.S. Cl.
CPC ........ *H01L 23/485* (2013.01); *H01L 27/0207* (2013.01); *H10B 99/00* (2023.02); *H01L 2924/0002* (2013.01)

(58) Field of Classification Search
CPC .......... H01L 29/66477; H01L 29/6653; H01L 29/783; H01L 21/28008–28273; H01L 21/283–2885; H01L 21/823468; H01L 21/823475; H01L 21/823871; H01L 21/8239; H01L 21/76895; H01L 21/76897; H10B 10/12; H10B 99/00
See application file for complete search history.

(56) References Cited

U.S. PATENT DOCUMENTS

| | | |
|---|---|---|
| 6,274,409 B1 | 8/2001 | Choi |
| 7,510,960 B2 | 3/2009 | Toomey |
| 7,633,126 B2 | 12/2009 | Matsui |
| 2004/0178516 A1 | 9/2004 | Ogata |
| 2007/0080423 A1 | 4/2007 | Tsuboi et al. |
| 2007/0085151 A1 | 4/2007 | Kotani |
| 2009/0014796 A1* | 1/2009 | Liaw ................ H01L 21/32115 257/E29.345 |
| 2009/0108379 A1 | 4/2009 | Oosuka et al. |
| 2010/0237419 A1 | 9/2010 | Yang et al. |
| 2012/0211843 A1 | 8/2012 | Jung et al. |
| 2014/0103445 A1 | 4/2014 | Chiu et al. |
| 2014/0349476 A1 | 11/2014 | Chen et al. |
| 2015/0194432 A1 | 7/2015 | Lee |

FOREIGN PATENT DOCUMENTS

| | | |
|---|---|---|
| KR | 20010076341 A | 8/2001 |
| KR | 20020072844 A | 9/2002 |
| KR | 20140043019 A | 4/2014 |
| KR | 20140048789 A | 4/2014 |

OTHER PUBLICATIONS

Korean Notice of Allowance; Application No. 10-2014-0163687; dated Nov. 27, 2015.

Korean Office Action; Application No. 10-2014-0163695; dated Nov. 30, 2015.

Korean Notice of Allowance; Application No. 10-2014-0163695; dated Dec. 26, 2015.

* cited by examiner

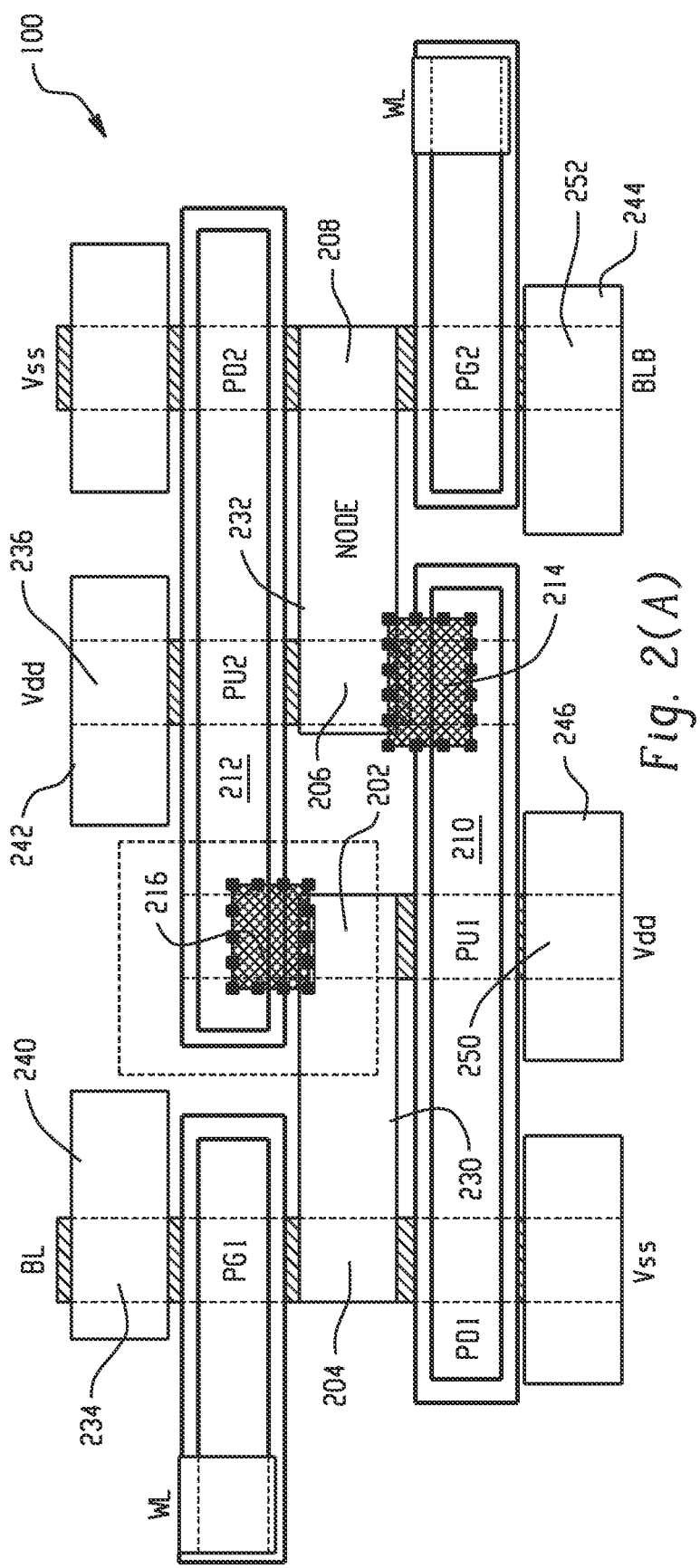
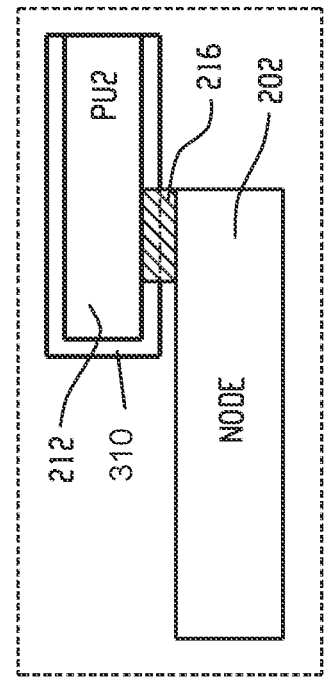
Fig. 2(A)
Fig. 2(B)

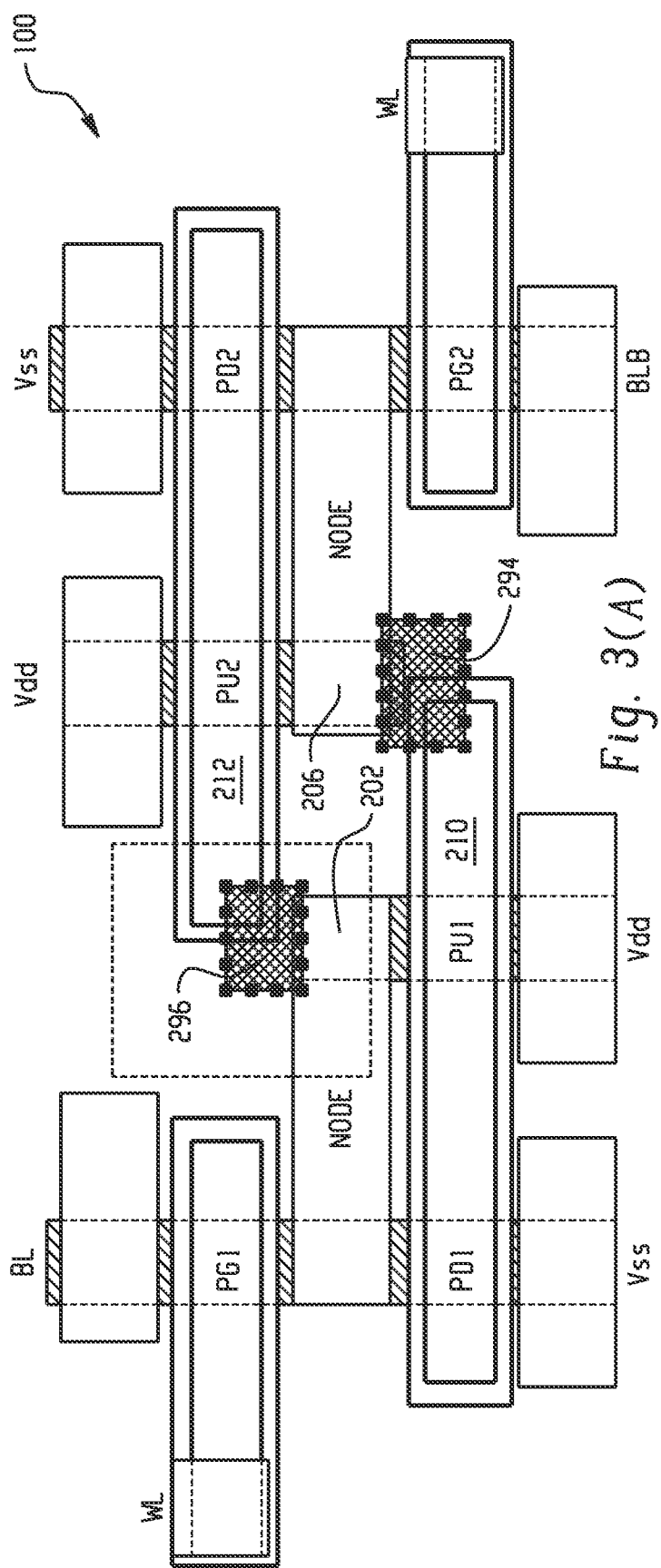
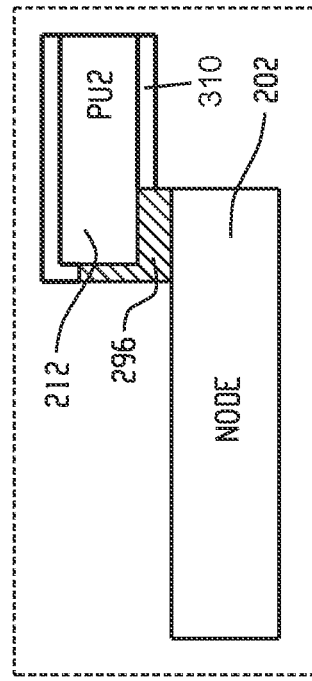
Fig. 3(A)
Fig. 3(B)

METHOD, STRUCTURES AND DEVICES FOR INTRA-CONNECTION STRUCTURES

PRIORITY CLAIM AND CROSS-REFERENCE

This application is a continuation of U.S. patent application Ser. No. 16/397,353 filed Apr. 29, 2019, which is a continuation of U.S. patent application Ser. No. 15/658,660 filed Jul. 25, 2017, now U.S. Pat. No. 10,276,580 issued on Apr. 30, 2019, which is a divisional of U.S. patent application Ser. No. 14/278,375 filed May 15, 2014, now U.S. Pat. No. 9,721,956 issued Aug. 1, 2017, which are incorporated herein by reference in their entirety.

BACKGROUND

The technology described in this disclosure relates generally to semiconductor devices and more particularly to fabrication of semiconductor devices.

Static random access memory (SRAM) devices are widely used for electronic applications where high speed, low power consumption and simple operations are needed. A SRAM device often includes a number of memory cells, and each cell may contain multiple components, such as transistors, active areas of the transistors, intra-cell connections, and contacts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2(A) depicts an example layout diagram of the SRAM cell as shown in FIG. 1, in accordance with some embodiments.

FIG. 2(B) depicts an example diagram showing an intra-connection structure as shown in FIG. 2(A), in accordance with some embodiments.

FIG. 3(A) depicts another example layout diagram of the SRAM cell as shown in FIG. 1, in accordance with some embodiments.

FIG. 3(B) depicts an example diagram showing an intra-connection structure as shown in FIG. 3(A), in accordance with some embodiments.

DETAILED DESCRIPTION

Figure 1:
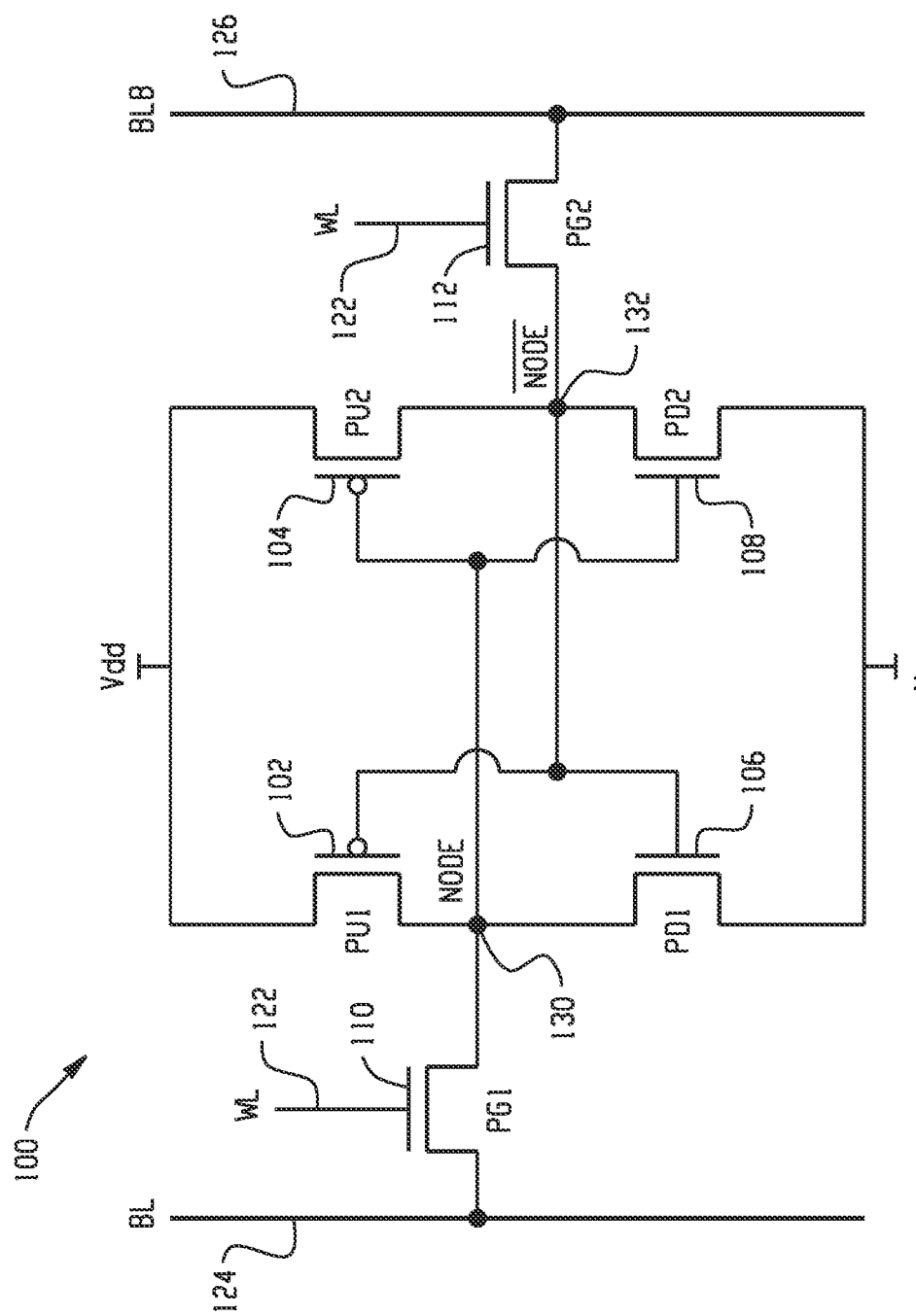
FIG. 1 depicts an example diagram of a six-transistor (6-T) SRAM cell, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "in," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As feature sizes of semiconductor devices continue to shrink, various problems may emerge in device fabrication. For SRAM devices, as the memory cell size becomes smaller, individual components in the memory cell, such as transistors, active areas of the transistors, intra-cell connections, and contacts, would naturally need to become smaller. However, current lithography and etching techniques limit how much the individual components can be shrunk. Thus, a memory cell of a SRAM device that includes a large density of components often has overlay problems. Any overlay would lead to a short circuit between different components and may cause device failure.

FIG. 1 depicts an example diagram of a six-transistor (6-T) SRAM cell, in accordance with some embodiments. As shown in FIG. 1, the SRAM cell 100 includes two pull-up transistors 102 ("PU1") and 104 ("PU2"), two pull-down transistors 106 ("PD1") and 108 ("PD2"), and two pass-gate transistors 110 ("PG1") and 112 ("PG2"). The transistors 102, 104, 106 and 108 are connected in cross-coupled inverter configuration. That is, the transistors 102 and 106 form a first inverter, and the transistors 104 and 108 form a second inverter. Gate terminals of the pass-gate transistors 110 and 112 are both configured to receive a word-line signal 122 ("WL"). A pair of complementary bit lines 124 ("BL") and 126 ("BLB") are coupled to source/drain regions of the pass-gate transistors 110 and 112 respectively. The pass-gate transistors 110 is coupled to the pull-up transistor 102 and the pull-down transistor 106 at a node 130, and the pass-gate transistors 112 is coupled to the pull-up transistor 104 and the pull-down transistor 108 at another node 132. For example, the pull-up transistors 102 and 104 are P-channel transistors, and the pull-down transistors 106 and 108 are N-channel transistors. The pass-gate transistors 110 and 112 are N-channel transistors.

FIG. 2(A) depicts an example layout diagram of the SRAM cell as shown in FIG. 1, in accordance with some embodiments. As shown in FIG. 2(A), the transistors 102, 104, 106 and 108 are interconnected (e.g., through metal contacts, contact bars, or slot contacts). A source/drain region 202 of the transistor 102 ("PU1") is connected to a source/drain region 204 of the transistor 106 ("PD1") through a conduction structure 230 that corresponds to the node 130. A source/drain region 206 of the transistor 104 ("PU2") is connected to a source/drain region 208 of the transistor 108 ("PD2") through a conduction structure 232 that corresponds to the node 132.

Furthermore, an intra-connection structure 214 connects a gate structure 210 of the transistor 102 ("PU1") and the source/drain region 206 of the transistor 104 ("PU2") laterally, so as to avoid overlay problems associated with vertical connection structures. As the intra-connection structure 214 is disposed laterally between the gate structure 210 and the source/drain region 206, the intra-connection structure 214 may not come into contact with a conduction structure 244 associated with a source/drain region 252 of the pass-gate transistor 112 ("PG2") or a conduction structure 246 associated with a source/drain region 250 of the transistor 102 ("PU1").

Similarly, another intra-connection structure 216 connects a gate structure 212 of the transistor 104 ("PU2") and the source/drain region 202 of the transistor 102 ("PU1") laterally. As the intra-connection structure 216 is disposed laterally between the gate structure 212 and the source/drain region 202, the intra-connection structure 216 may not come into contact with a conduction structure 240 associated with a source/drain region 234 of the pass-gate transistor 110 ("PG1") or a conduction structure 242 associated with a source/drain region 236 of the transistor 104 ("PU2").

For example, the conduction structure 230 and the conduction structure 232 include one or more conductive materials (e.g., metal-based materials). The intra-connection structure 214 and the intra-connection structure 216 include one or more conductive materials (e.g., metal-based materials). The gate structure 210 and the gate structure 212 include one or more conductive materials (e.g., metal-based materials, polysilicon).

FIG. 2(B) depicts an example diagram showing the intra-connection structure 216, in accordance with some embodiments. As shown in FIG. 2(B), the gate structure 210 of the transistor 102 ("PU1") is electrically connected to the source/drain region 206 of the transistor 104 ("PU2") through the intra-connection structure 216. Specifically, the intra-connection structure 216 is in contact with one side of the gate structure 212 of the transistor 104 ("PU2").

FIG. 3(A) depicts another example layout diagram of the SRAM cell as shown in FIG. 1, in accordance with some embodiments. As shown in FIG. 3(A), the transistors 102, 104, 106 and 108 are interconnected (e.g., through metal contacts, contact bars, or slot contacts), similar to FIG. 2(A). An intra-connection structure 294 connects the gate structure 210 of the transistor 102 ("PU1") and the source/drain region 206 of the transistor 104 ("PU2") laterally. Similarly, another intra-connection structure 296 connects the gate structure 212 of the transistor 104 ("PU2") and the source/drain region 202 of the transistor 102 ("PU1") laterally.

FIG. 3(B) depicts an example diagram showing the intra-connection structure 296, in accordance with some embodiments. As shown in FIG. 3(B), the gate structure 210 of the transistor 102 ("PU1") is electrically connected to the source/drain region 206 of the transistor 104 ("PU2") through the intra-connection structure 296. Specifically, the intra-connection structure 296 is in contact with one side and an end of the gate structure 212 of the transistor 104 ("PU2").

Figure 4A:
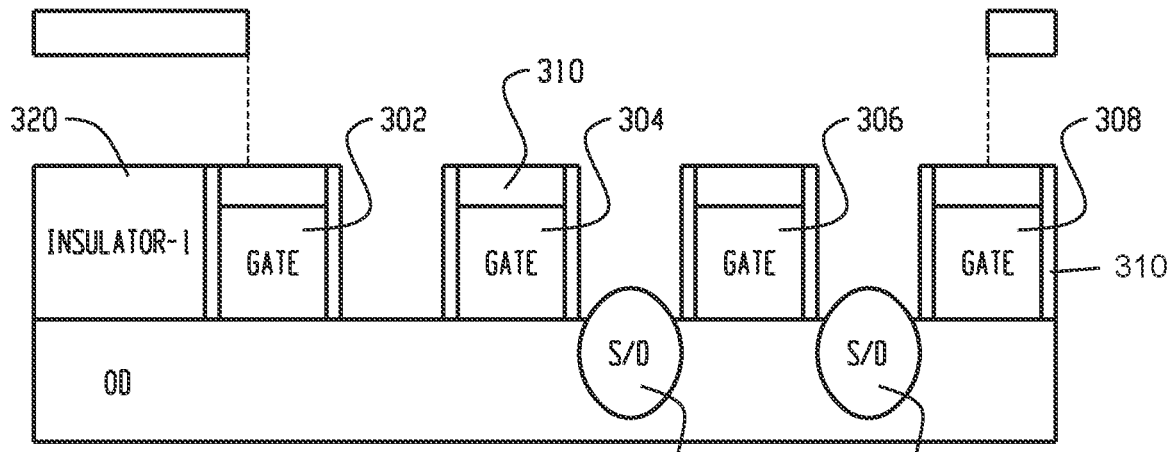
FIG. 4(A)-FIG. 4(D) depict example diagrams showing a process for fabricating a device structure including an intra-connection structure, in accordance with some embodiments.

FIG. 4(A)-FIG. 4(D) depict example diagrams showing a process for fabricating a device structure including an intra-connection structure, in accordance with some embodiments. One or more fabrication processes (e.g., lithography, deposition, and/or etching) may be carried out to yield a structure as shown in FIG. 4(A). For example, a sacrificial dielectric material (e.g., an insulating material 320) that is formed between multiple gate structures (e.g., the gate structures 302, 304, 306 and 308) is removed (e.g., through etching) after a lithography process. One or more source/drain regions (e.g., the source/drain regions 312 and 314) are disposed between the gate structures and—exposed at least partially after the removal of the sacrificial dielectric material. A spacer material is disposed on each gate structure. As shown in FIG. 4(A), the spacer material 310 covers at least part of the gate structure 304, e.g., on a top surface and sidewalls of the gate structure 304. For example, the spacer material 310 includes a dielectric material (e.g., silicon nitride).

Figure 4B:
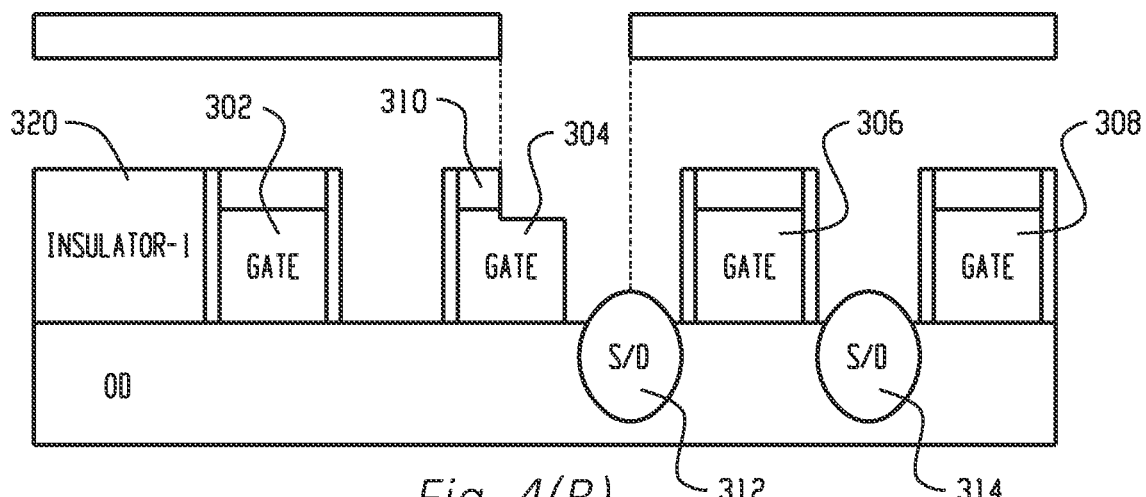

Another lithography process is performed, and part of the spacer material 310 is removed (e.g., through etching) to expose part of the gate structure 304, as shown in FIG. 4(B). For example, the spacer material 310 on the top surface of the gate structure 304 is partially removed. In addition, the spacer material 310 on a side wall of the gate structure 304 adjacent to the source/drain region 312 is removed.

Figure 4C:
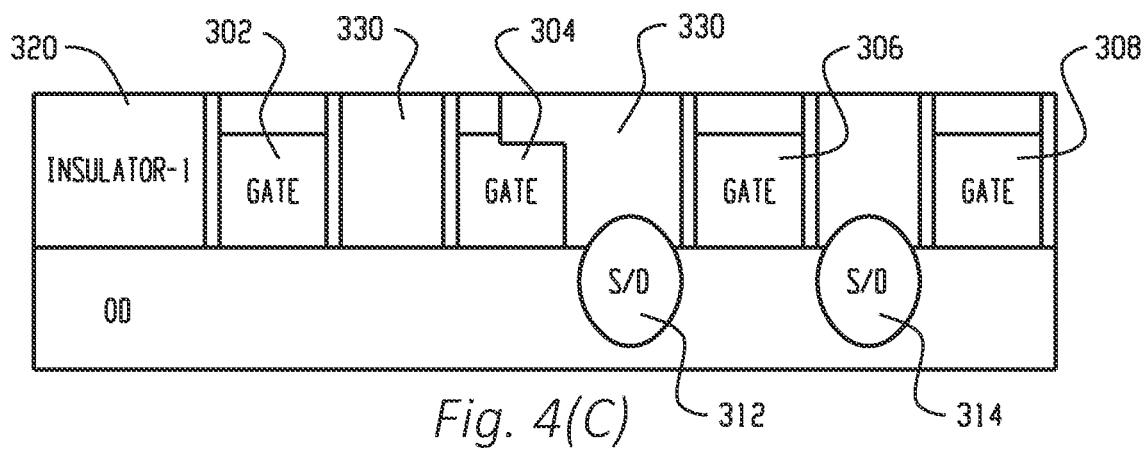

A conductive material 330 is formed (e.g., through lithography, deposition, etc.) on the gate structures and the source/drain regions. Chemical-mechanical planarization (CMP) is performed to remove part of the conductive material 330, as shown in FIG. 4(C). The conductive material 330 is in contact with the exposed gate structure 304 and the exposed source/drain regions 312 and is configured to electrically connect the gate structure 304 and the source/drain regions 312. For example, the conductive material 330 covers part of the top surface of the gate structure 304.

Figure 4D:
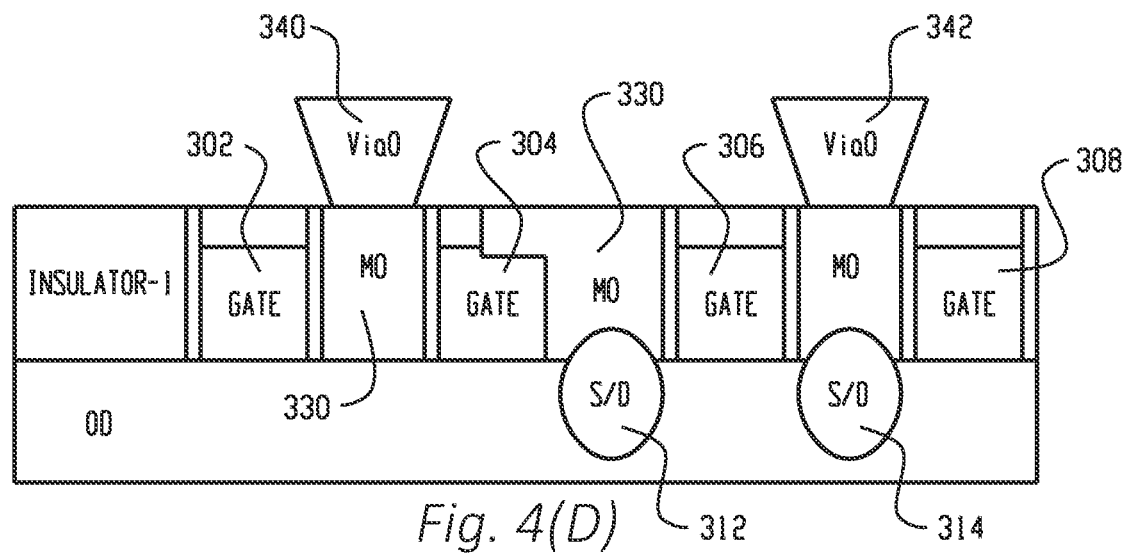

Another conductive material is formed (e.g., through lithography, deposition, etc.) to fabricate multiple vertical conduction structures (e.g., vias). As shown in FIG. 4(D), a vertical conduction structure 340 (e.g., a via) is formed on the conductive material 330 between the gate structure 302 and the gate structure 304, and another vertical conduction structure 342 (e.g., a via) is formed on the conductive material 330 between the gate structure 306 and the gate structure 308. The conductive material 330 between the gate structure 304 and the gate structure 306 serves as an intra-connection structure (e.g., the intra-connection structure 214 or the intra-connection structure 216 as shown in FIG. 2(A), the intra-connection structure 294 or the intra-connection structure 296 as shown in FIG. 3(A)).

Figure 5:
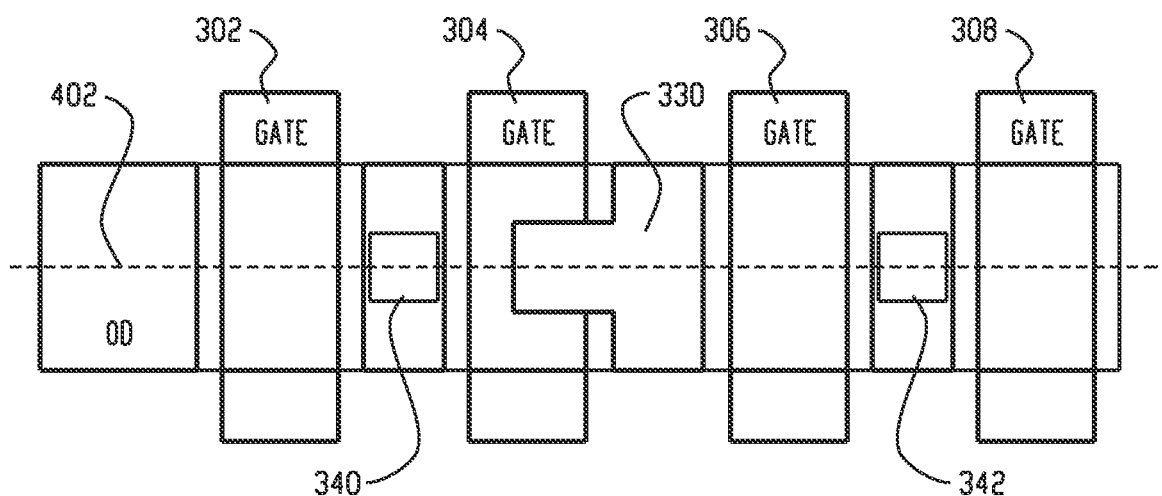
FIG. 5 depicts an example diagram showing a top view of the device structure as shown in FIG. 4(D), in accordance with some embodiments.

FIG. 5 depicts an example diagram showing a top view of the device structure as shown in FIG. 4(D), in accordance with some embodiments. As shown in FIG. 4(D) and FIG. 5, the conduction structures 340 and 342 have a smaller width at the bottom to reduce the risk of contacting the intra-connection structure that includes the conductive material 330 between the gate structures 304 and 306. The cross-sectional view shown in FIG. 4(D) is associated with the cutline 402.

Figure 6A:
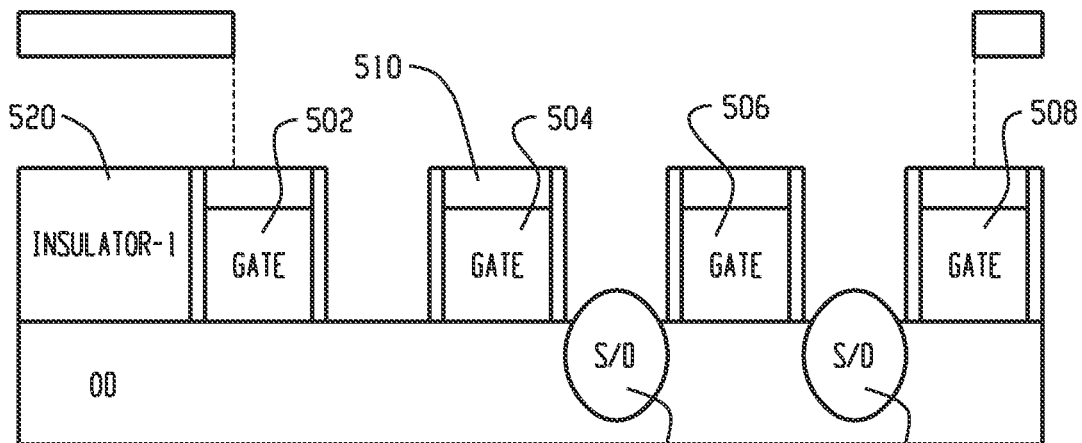
FIG. 6(A)-FIG. 6(D) depict example diagrams showing another process for fabricating a device structure including an intra-connection structure, in accordance with some embodiments.

FIG. 6(A)-FIG. 6(D) depict example diagrams showing another process for fabricating a device structure including an intra-connection structure, in accordance with some embodiments. One or more fabrication processes (e.g., lithography, deposition, and/or etching) may be carried out to yield a structure as shown in FIG. 6(A). For example, a sacrificial dielectric material (e.g., an insulating material 520) that is formed between multiple gate structures (e.g., the gate structures 502, 504, 506 and 508) is removed (e.g., through etching) after a lithography process. One or more source/drain regions (e.g., the source/drain regions 512 and 514) are disposed between the gate structures and exposed at least partially after the removal of the sacrificial dielectric material. A spacer material is disposed on each gate structure. As shown in FIG. 6(A), the spacer material 510 covers at least part of the gate structure 504, e.g., on a top surface and sidewalls of the gate structure 504. For example, the spacer material 510 includes a dielectric material (e.g., silicon nitride).

Figure 6B:
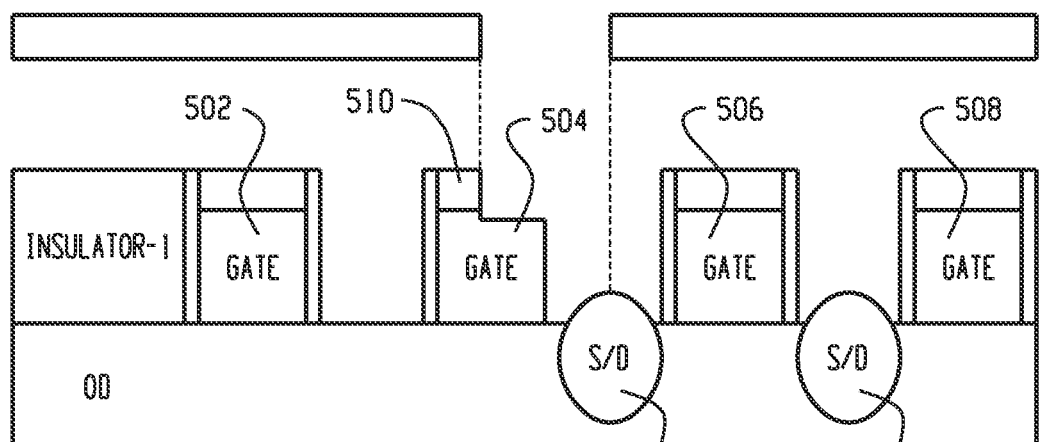

Another lithography process is performed, and part of the spacer material 510 is removed (e.g., through etching) to expose part of the gate structure 504, as shown in FIG. 6(B). For example, the spacer material 510 on the top surface of the gate structure 504 is partially removed. In addition, the spacer material 510 on a side wall of the gate structure 504 adjacent to the source/drain region 512 is removed.

Figure 6C:
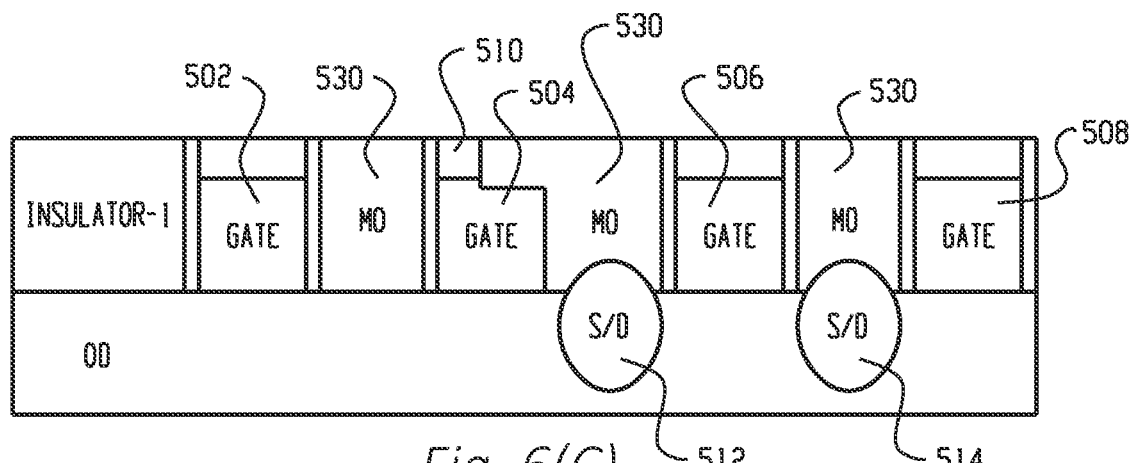

A conductive material 530 is formed (e.g., through lithography, deposition, etc.) on the gate structures and the source/drain regions. A CMP process is performed to remove part of the conductive material 530, as shown in FIG. 6(C). The conductive material 530 is in contact with the exposed gate structure 504 and the exposed source/drain regions 512 and is configured to electrically connect the gate structure 504 and the source/drain regions 512. For example, the conductive material 530 covers part of the top surface of the gate structure 504.

In certain embodiments, after the CMP process, the conductive material 530 does not cover any part of the top surface of the gate structure 504, and is disposed completely between the gate structure 504 and the source/drain regions 512. A dielectric material (e.g., an insulating material) 550 is formed (e.g., through deposition, etc.) to cover the gate structures.

Figure 6D:
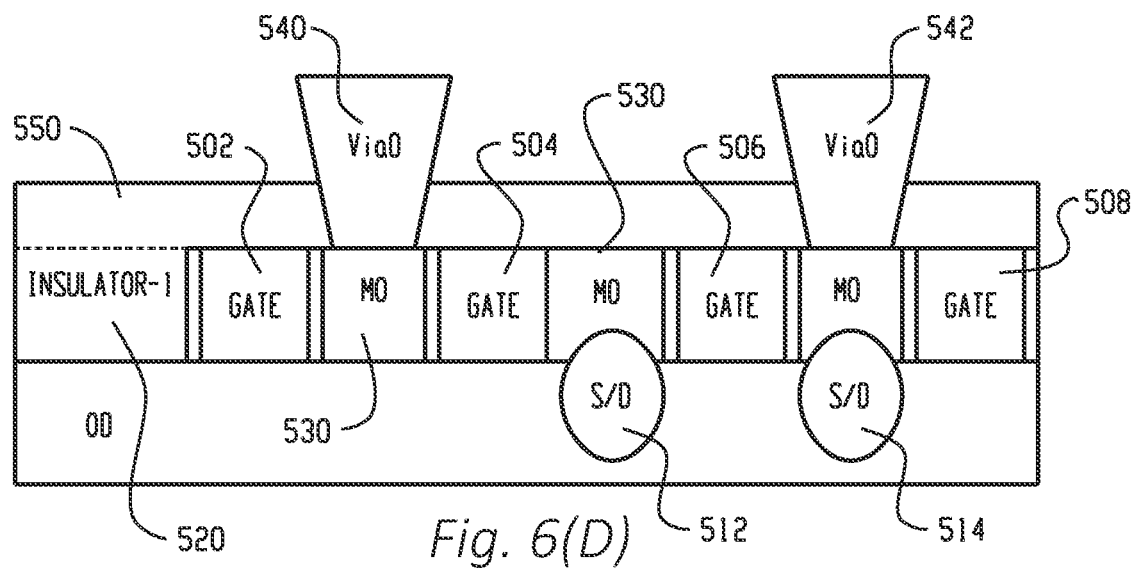

Another conductive material is formed (e.g., through lithography, deposition, etc.) to fabricate multiple vertical conduction structures (e.g., vias). As shown in FIG. 6(D), a vertical conduction structure 540 (e.g., a via) is formed on the conductive material 530 between the gate structure 502 and the gate structure 504, and another vertical conduction structure 542 (e.g., a via) is formed on the conductive material 530 between the gate structure 506 and the gate structure 508. The conductive material 530 between the gate structure 504 and the gate structure 506 serves as an intra-connection structure (e.g., the intra-connection structure 214 or the intra-connection structure 216 as shown in FIG. 2(A), the intra-connection structure 294 or the intra-connection structure 296 as shown in FIG. 3(A)).

Figure 7:
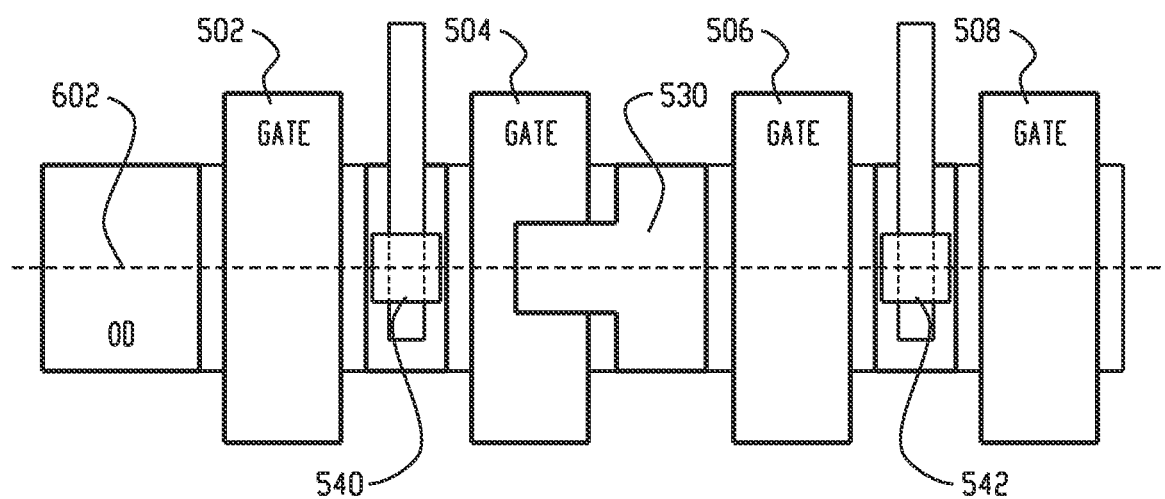
FIG. 7 depicts an example diagram showing a top view of the device structure as shown in FIG. 6(D), in accordance with some embodiments.

FIG. 7 depicts an example diagram showing a top view of the device structure as shown in FIG. 6(D), in accordance with some embodiments. As shown in FIG. 6(D) and FIG. 7, the intra-connection structure that includes the conductive material 530 between the gate structures 504 and 506 may not come into contact with the conduction structures 540 and 542. The cross-sectional view shown in FIG. 6(D) is associated with the cutline 602.

Figure 8A:
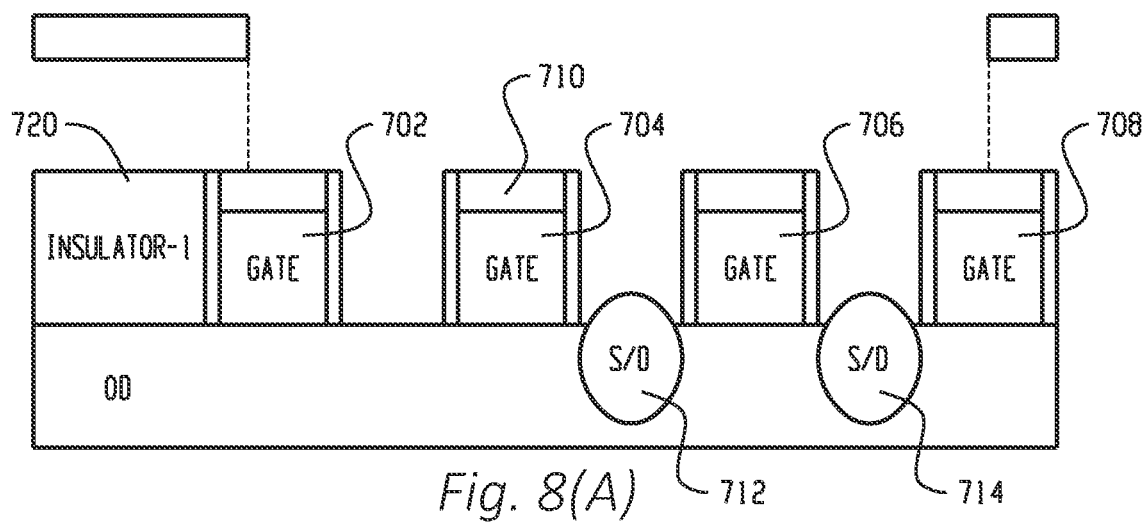
FIG. 8(A)-FIG. 8(E) depict example diagrams showing another process for fabricating a device structure including an intra-connection structure, in accordance with some embodiments.

FIG. 8(A)-FIG. 8(D) depict example diagrams showing another process for fabricating a device structure including an intra-connection structure, in accordance with some embodiments. One or more fabrication processes (e.g., lithography, deposition, and/or etching) may be carried out to yield a structure as shown in FIG. 8(A). For example, a sacrificial dielectric material (e.g., an insulating material 720) that is formed between multiple gate structures (e.g., the gate structures 702, 704, 706 and 708) is removed (e.g., through etching) after a lithography process. One or more source/drain regions (e.g., the source/drain regions 712 and 714) are disposed between the gate structures and exposed at least partially after the removal of the sacrificial dielectric material. A spacer material is disposed on each gate structure. As shown in FIG. 8(A), the spacer material 710 covers at least part of the gate structure 704, e.g., on a top surface and sidewalls of the gate structure 704.

Figure 8B:
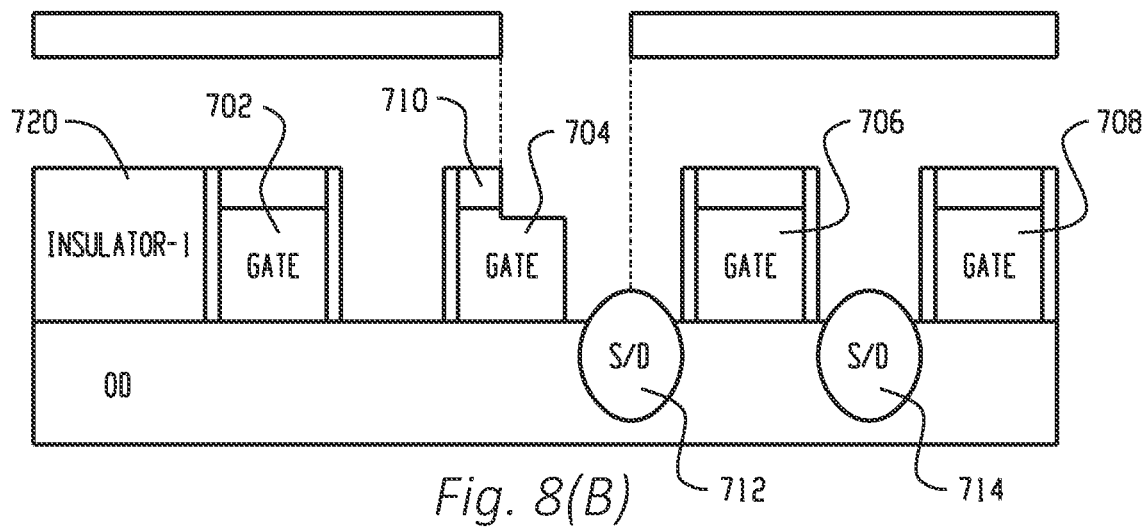
Figure 8C:
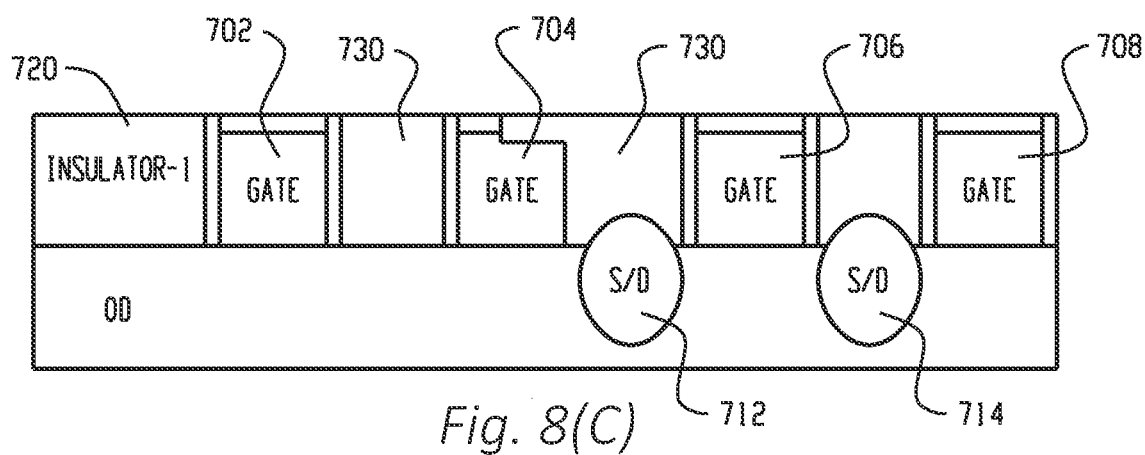

Another lithography process is performed, and part of the spacer material 710 is removed (e.g., through etching) to expose part of the gate structure 704, as shown in FIG. 8(B). For example, the spacer material 710 on the top surface of the gate structure 704 is partially removed. In addition, the spacer material 710 on a side wall of the gate structure 704 adjacent to the source/drain region 712 is removed.

A conductive material 730 is formed (e.g., through lithography, deposition, etc.) on the gate structures and the source/drain regions. A CMP process is performed to remove part of the conductive material 730, as shown in FIG. 4(C). The conductive material 730 is in contact with the exposed gate structure 704 and the exposed source/drain regions 712 and is configured to electrically connect the gate structure 704 and the source/drain regions 712. For example, the conductive material 730 covers part of the top surface of the gate structure 704.

In certain embodiments, after the CMP process, the conductive material 730 does not cover any part of the top surface of the gate structure 704, and is disposed completely between the gate structure 704 and the source/drain regions 712. A dielectric material (e.g., an insulating material) 750 is formed (e.g., through deposition, etc.) to cover the gate structures.

Figure 8D:
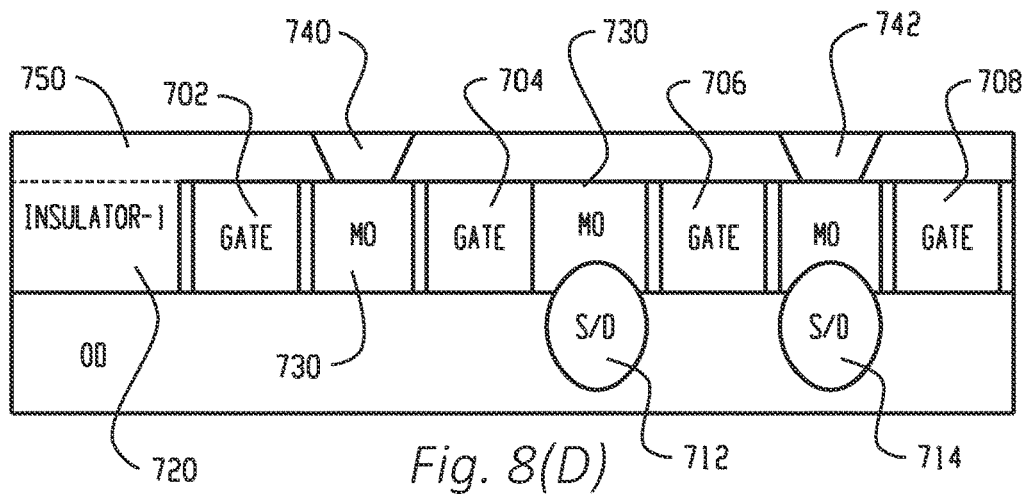

Another conductive material is formed (e.g., through lithography, deposition, etc.) to fabricate multiple vertical conduction structures (e.g., vias). As shown in FIG. 8(D), a vertical conduction structure 740 (e.g., a via) is formed on the conductive material 730 between the gate structure 702 and the gate structure 704, and another vertical conduction structure 742 (e.g., a via) is formed on the conductive material 730 between the gate structure 706 and the gate structure 708. The conductive material 730 between the gate structure 704 and the gate structure 706 serves as an intra-connection structure (e.g., the intra-connection structure 214 or the intra-connection structure 216 as shown in FIG. 2(A), the intra-connection structure 294 or the intra-connection structure 296 as shown in FIG. 3(A)). Higher level vertical conduction structures 760 and 762 (e.g., vias) may be fabricated (e.g., through lithography, deposition, etc.) on the conduction structures 740 and 742 respectively, as shown in FIG. 8(E).

Figure 8E:
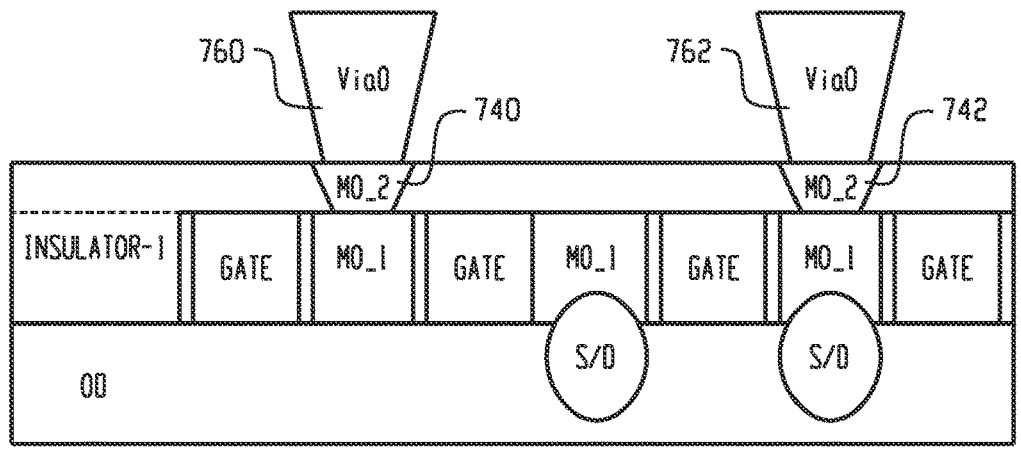
Figure 9:
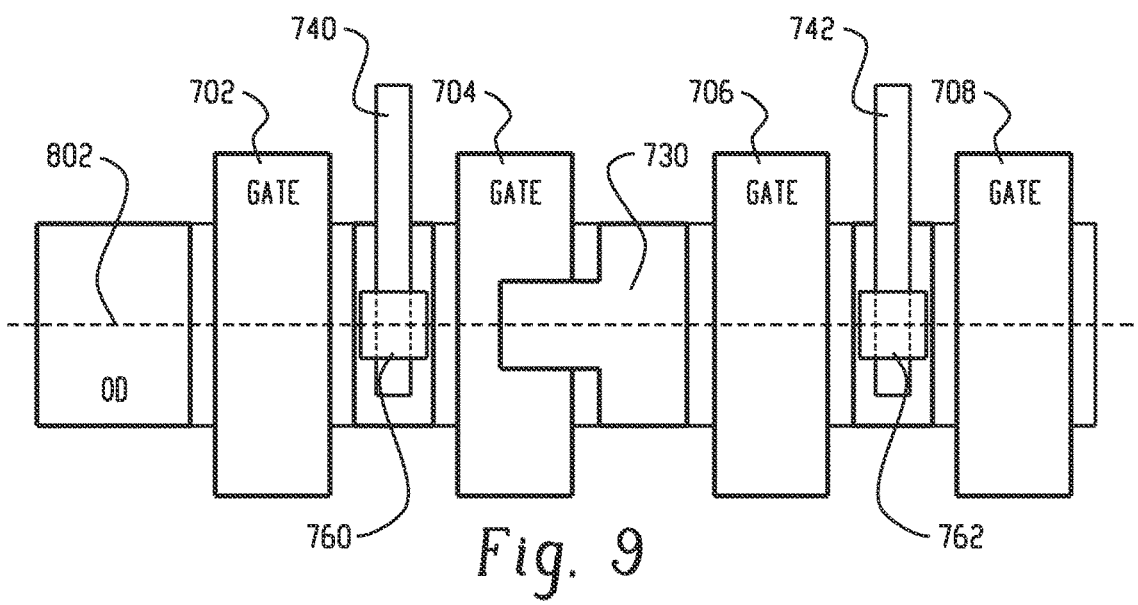
FIG. 9 depicts an example diagram showing a top view of the device structure as shown in FIG. 8(E), in accordance with some embodiments.

FIG. 9 depicts an example diagram showing a top view of the device structure as shown in FIG. 8(E), in accordance with some embodiments. As shown in FIG. 9, the conduction structures 740 and 742 extend parallel to the gate structures, and may be used for interconnection between different active regions. The intra-connection structure that includes the conductive material 730 between the gate structures 704 and 706 may not come into contact with the conduction structures 740, 742, 760 and 762. The cross-sectional view shown in FIG. 8(E) is associated with the cutline 802.

Figure 10A:
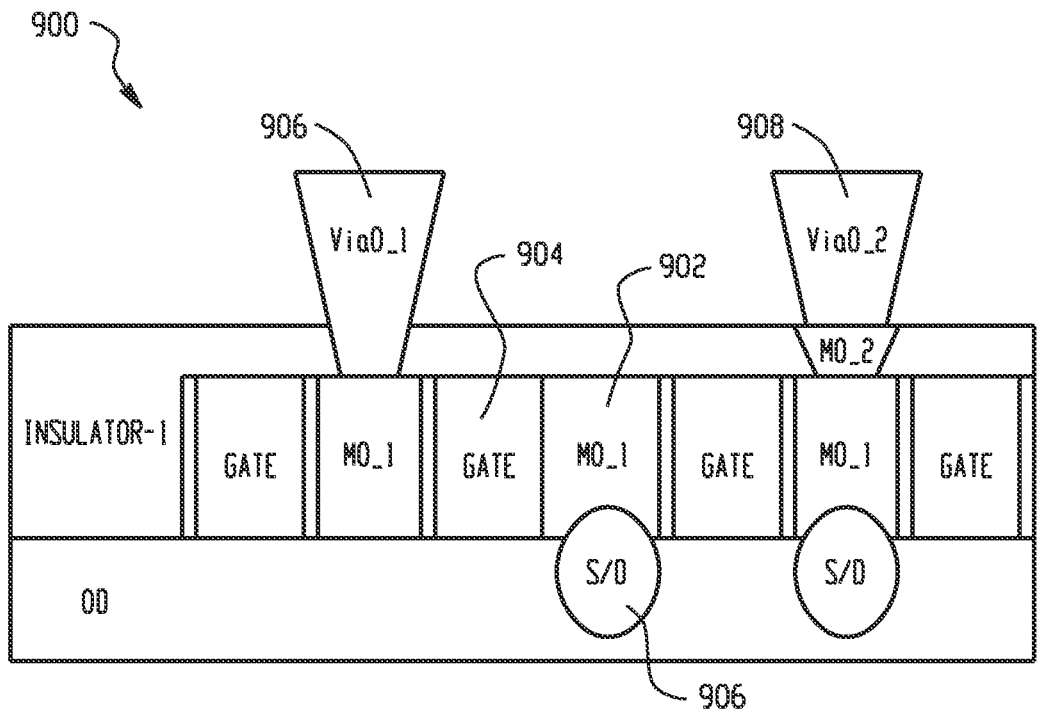
FIG. 10(A) depicts an example diagram showing a cross-sectional view of a device structure including an intra-connection structure, in accordance with some embodiments.
Figure 10B:
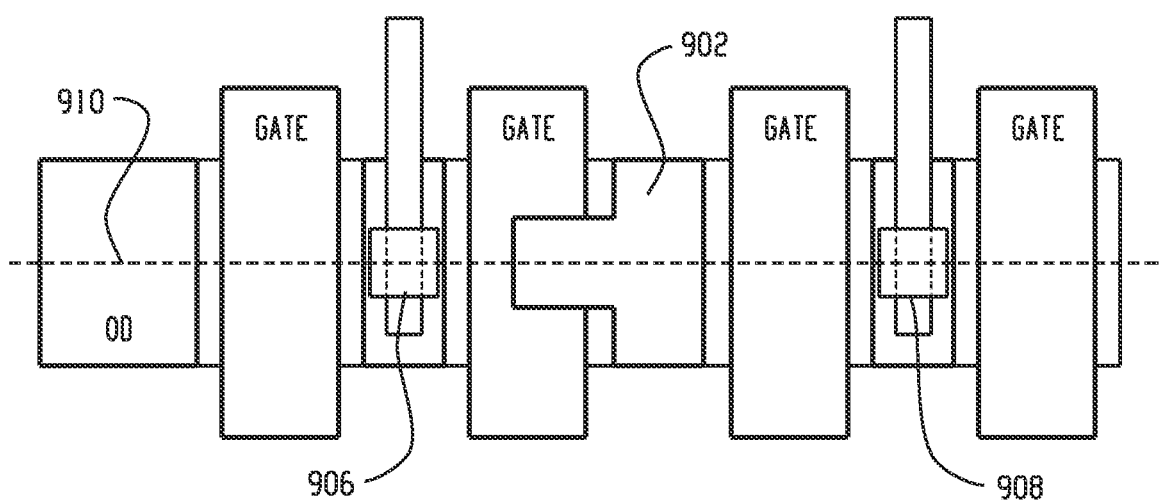
FIG. 10(B) depicts an example diagram showing a top view of the device structure as shown in FIG. 10(A), in accordance with some embodiments.
Figure 11A:
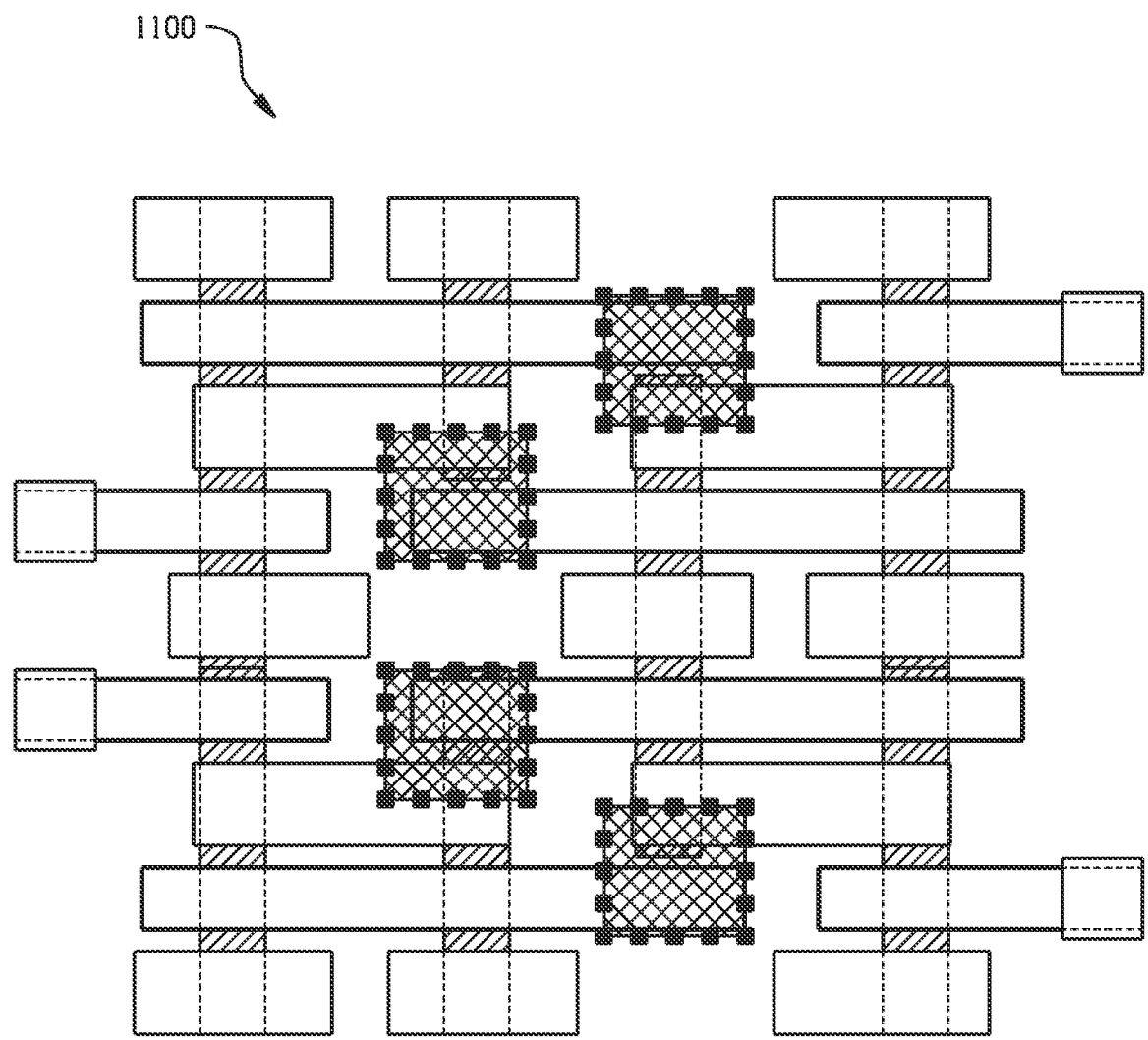
FIG. 11(A)-FIG. 11(E) depict example diagrams showing different masks for fabricating a device structure including an intra-connection structure, in accordance with some embodiments.
Figure 11B:
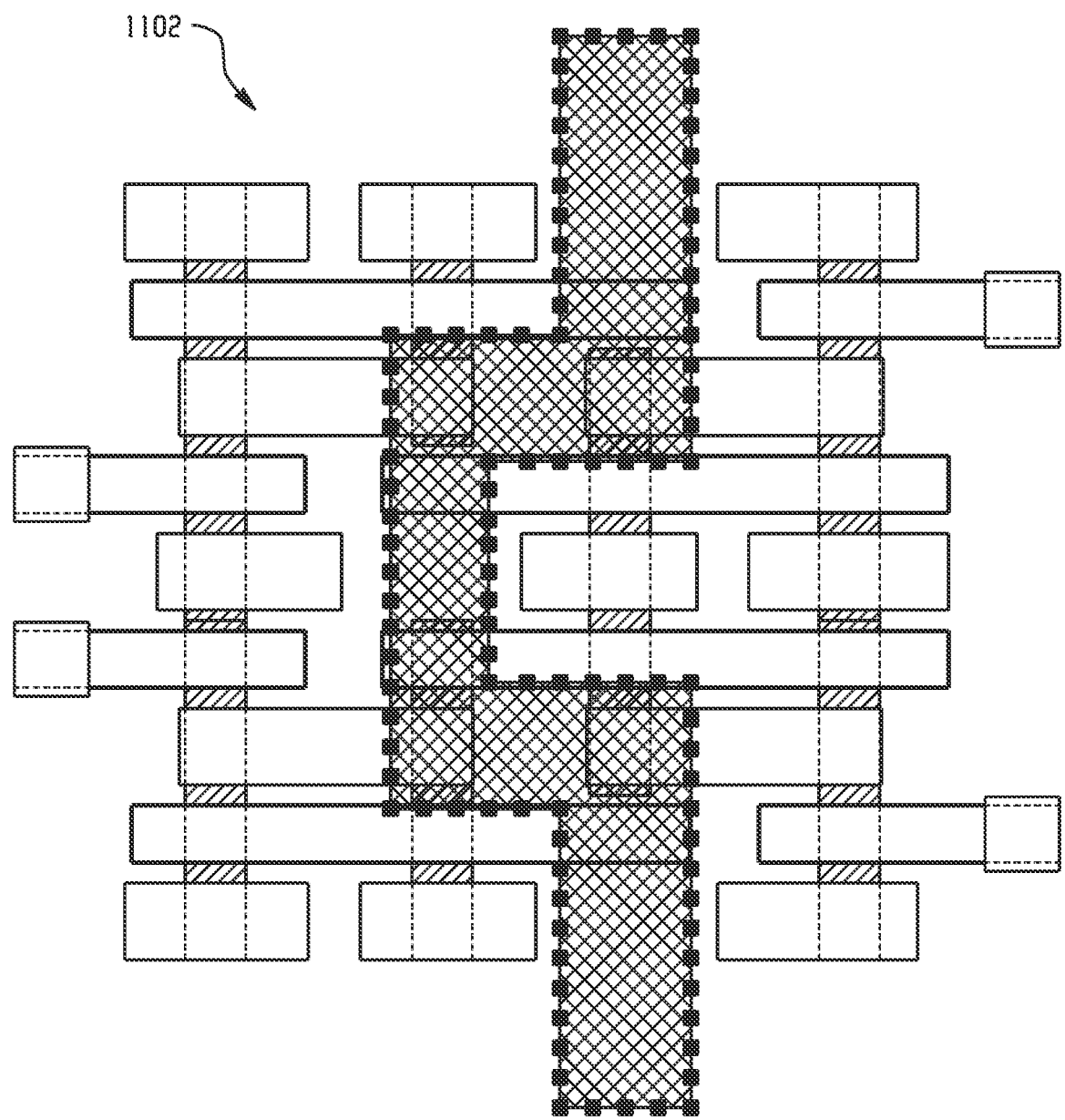
Figure 11C:
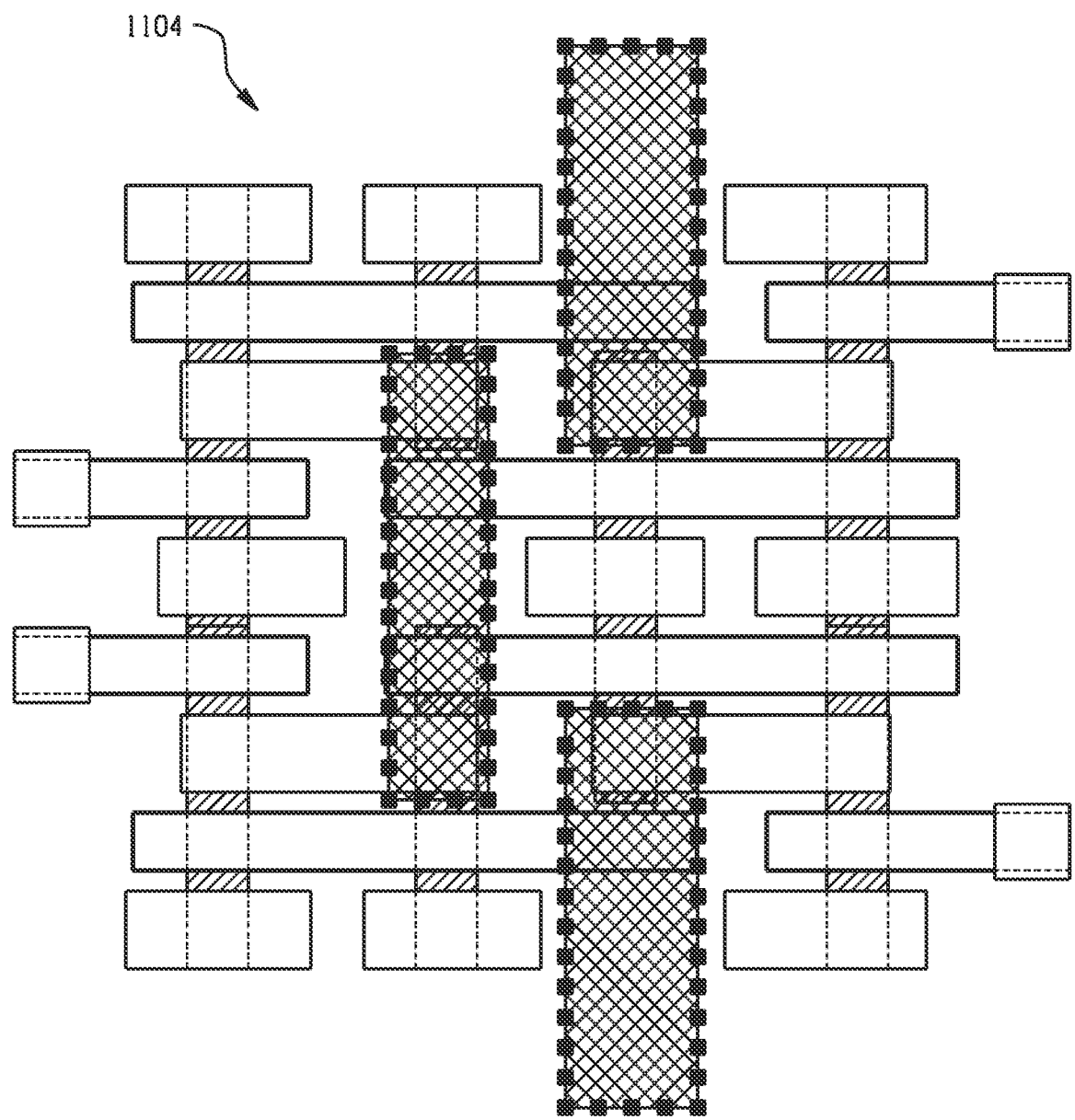
Figure 11D:
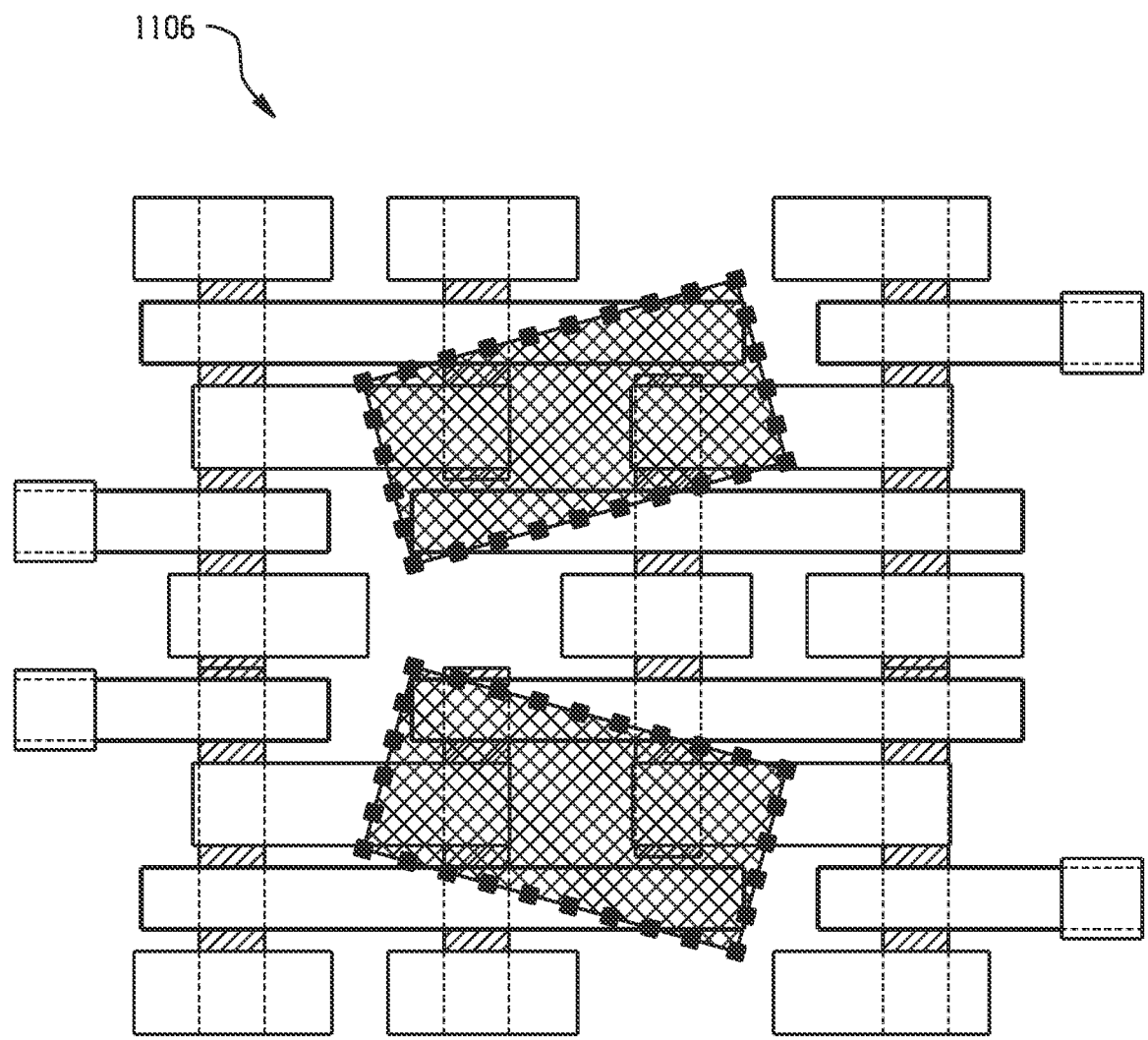
Figure 11E:
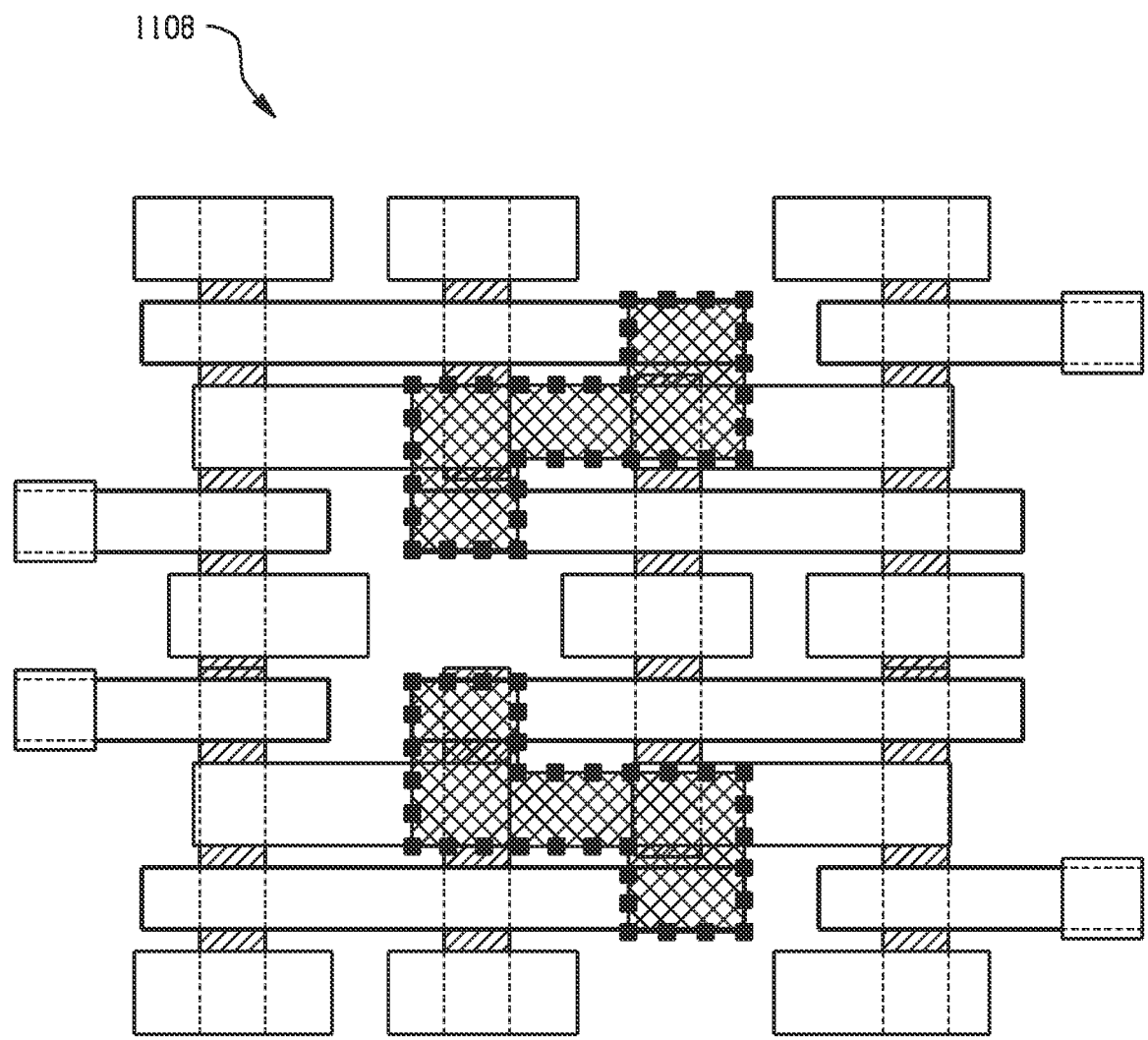

FIG. 10(A) depicts an example diagram showing a cross-sectional view of a device structure including an intra-connection structure, in accordance with some embodiments. The device structure 900 includes an intra-connection structure 902 between a gate structure 904 and a source/drain region 906. In addition, the device structure 900 includes different vertical conduction structures. As shown in FIG. 10(A), a vertical conduction structure 908 that includes a single conductive material may be formed through a process similar to what is shown in FIG. 6(A)-FIG. 6(D). Another vertical conduction structure 910 that includes two layers of conductive materials may be formed through a process similar to what is shown in FIG. 8(A)-FIG. 8(E). FIG. 10(B) depicts an example diagram showing a top view of the device structure as shown in FIG. 10(A), in accordance with some embodiments. The cross-sectional view shown in FIG. 10(A) is associated with the cutline 910.

FIG. 11(A)-FIG. 11(E) depict example diagrams showing different masks for fabricating a device structure including an intra-connection structure, in accordance with some embodiments. As shown in FIG. 11(A)-FIG. 11(E), the masks 1100, 1102, 1104, 1106 and 1108 can all be used for defining an intra-connection structure by removing part of a spacer material on a gate structure. Specifically, the mask 1100 includes simple pattern shapes with small pattern areas, and the mask 1102 may be implemented by a single patterning. In addition, the mask 1104 includes simple shapes with large pattern areas, and both the mask 1106 and the mask 1108 include large pattern areas.

Figure 12:
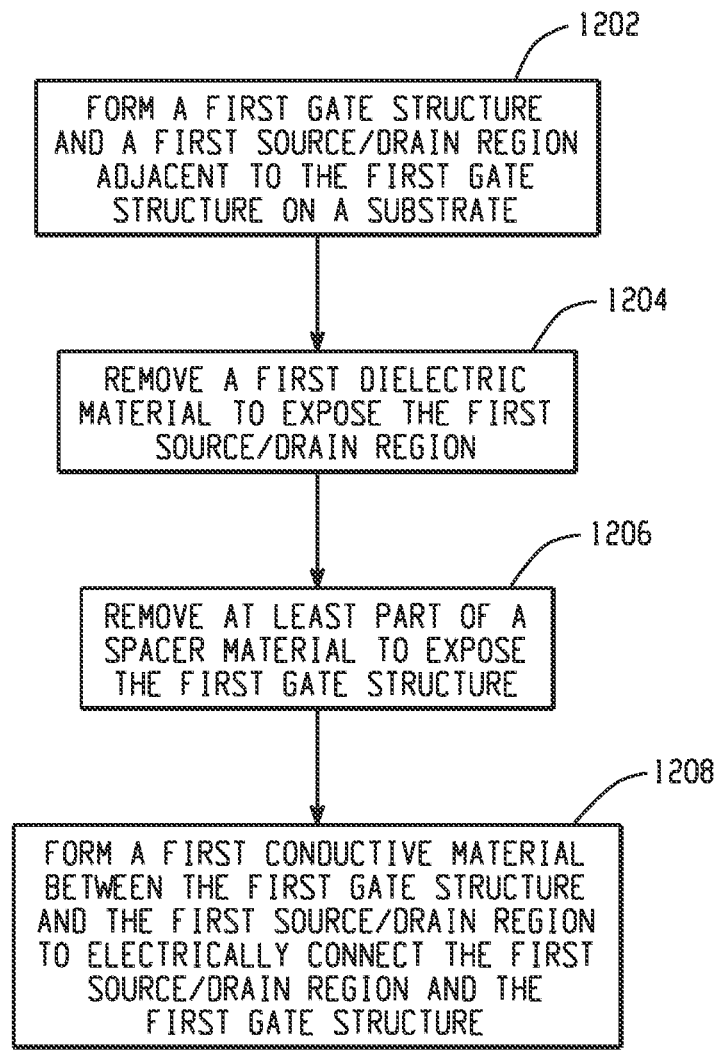
FIG. 12 depicts an example flow chart for fabricating a device structure including an intra-connection structure, in accordance with some embodiments.

FIG. 12 depicts an example flow chart for fabricating a device structure including an intra-connection structure, in accordance with some embodiments. At 1202, a first gate structure and a first source/drain region adjacent to the first gate structure are formed on a substrate (e.g., "OD" in FIGS. 4(A) through 10(B)). A first dielectric material is disposed on the first source/drain region. A spacer material is formed on the first gate structure. At 1204, the first dielectric material is removed to expose at least part of the first source/drain region. At 1206, at least part of the spacer material is removed to expose at least part of the first gate structure. At 1208, a first conductive material is formed between the first gate structure and the first source/drain region to electrically connect the first source/drain region and the first gate structure.

According to one embodiment, a method is provided for forming an intra-connection structure. A first gate structure and a first source/drain region adjacent to the first gate structure are formed on a substrate. A first dielectric material is disposed on the first source/drain region. A spacer material is formed on the first gate structure. The first dielectric material is removed to expose the first source/drain region. At least part of the spacer material is removed to expose the first gate structure. A first conductive material is formed between the first gate structure and the first source/drain region to electrically connect the first source/drain region and the first gate structure.

According to another embodiment, a structure includes: a first gate structure formed on a substrate, a first source/drain region adjacent to the first gate structure, and a first conductive material formed between the first gate structure and the first source/drain region. The first conductive material is in contact with part of the first gate structure and in contact with part of the first source/drain region.

According to yet another embodiment, a device includes: a gate structure associated with a first transistor, a source/drain region associated with a second transistor, the source/drain region being adjacent to the gate structure, and an intra-connection conductive material disposed in contact with a sidewall of the first gate structure and a top surface of the first source/drain region.

In an embodiment, a device comprises: a first pull-up transistor comprising a first source/drain region and a first gate structure; a second pull-up transistor comprising a second source/drain region and a second gate structure; a first contact contacting the first source/drain region, the first contact extending into a second side of the second gate structure, the first contact physically contacting a top surface and an entirety of a sidewall of the second gate structure; a first spacer separating the first contact from a first side of the first gate structure, top surfaces of the first spacer and the first contact being coplanar; a second contact contacting the second source/drain region, the second contact extending into the first side of the first gate structure, the second contact physically contacting a top surface and an entirety of a sidewall of the first gate structure; and a second spacer separating the second contact from the second side of the second gate structure, top surfaces of the second spacer and the second contact being coplanar.

In an embodiment, a device comprises: a first static random-access memory pull-up transistor comprising a gate structure over a semiconductor substrate; a second static random-access memory pull-up transistor comprising a first source/drain region in the semiconductor substrate adjacent the gate structure; a first spacer disposed between the first source/drain region and the gate structure; and a first contact over and physically contacting the first source/drain region and the semiconductor substrate, the first contact extending through the first spacer and into a side of the gate structure, the first contact over and physically contacting the gate structure, a top surface of the first contact being coplanar with a top surface of the first spacer.

In an embodiment, a device comprises: a first pull-up transistor comprising a first source/drain region in a semiconductor substrate, a second source/drain region in the semiconductor substrate, and a first gate structure over the semiconductor substrate; a second pull-up transistor comprising a second gate structure, the second gate structure having a first top surface and a second top surface, the first top surface being disposed further from the semiconductor substrate than the second top surface; a first contact over the first source/drain region, the first contact physically contacting the first source/drain region, the first contact physically contacting a portion of the semiconductor substrate between the first source/drain region and the second gate structure, the first contact extending into a side of the second gate structure, the first contact physically contacting the second top surface of the second gate structure; a second contact over the second source/drain region, the second contact physically contacting the second source/drain region, the second contact separated from a side of the first gate structure; a first dielectric layer over the first gate structure, the second gate structure, the first contact, and the second contact; and a via extending through the first dielectric layer to contact the second contact, the via separated from the first contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first pull-up transistor comprising a first source/drain region and a first gate structure;
   a second pull-up transistor comprising a second source/drain region and a second gate structure;
   a first contact contacting the first source/drain region, the first contact extending into a second side of the second gate structure, the first contact physically contacting a top surface and an entirety of a sidewall of the second gate structure;
   a first spacer separating the first contact from a first side of the first gate structure, top surfaces of the first spacer and the first contact being coplanar;
   a second contact contacting the second source/drain region, the second contact extending into the first side of the first gate structure, the second contact physically contacting a top surface and an entirety of a sidewall of the first gate structure; and
   a second spacer separating the second contact from the second side of the second gate structure, top surfaces of the second spacer and the second contact being coplanar.

2. The device of claim 1, wherein the first contact extends through the second spacer, and the second contact extends through the first spacer.

3. The device of claim 1 further comprising:
   a dielectric layer on top surfaces of the first contact, the second contact, the first gate structure, and the second gate structure.

4. The device of claim 3, wherein the top surfaces of the first contact, the second contact, the first gate structure, and the second gate structure are coplanar.

5. The device of claim 1 further comprising:
   a first dielectric layer on the first gate structure; and
   a second dielectric layer on the second gate structure.

6. The device of claim 5, wherein top surfaces of the first contact, the second contact, the first dielectric layer, and the second dielectric layer are coplanar, the device further comprising:
   a third dielectric layer on the top surfaces of the first contact, the second contact, the first dielectric layer, and the second dielectric layer.

7. The device of claim 1, wherein the first contact and the second contact each have an upper portion and a lower portion, the upper portion having a first width, the lower portion having a second width, the first width greater than the second width.

8. A device comprising:
   a first static random-access memory pull-up transistor comprising a gate structure over a semiconductor substrate;
   a second static random-access memory pull-up transistor comprising a first source/drain region in the semiconductor substrate adjacent the gate structure;
   a first spacer disposed between the first source/drain region and the gate structure; and
   a first contact over and physically contacting the first source/drain region and the semiconductor substrate, the first contact extending through the first spacer and into a side of the gate structure, the first contact over and physically contacting the gate structure, a top surface of the first contact being coplanar with a top surface of the first spacer.

9. The device of claim 8, wherein the first contact has an upper width and a lower width, the upper width being greater than the lower width.

10. The device of claim 8 further comprising:
    a first dielectric layer on the gate structure, a top surface of the first dielectric layer being coplanar with the top surface of the first contact and the top surface of the first spacer; and
    a second dielectric layer on the top surface of the first dielectric layer, the top surface of the first spacer, and the top surface of the first contact.

11. A device comprising:
    a first pull-up transistor comprising a first source/drain region in a semiconductor substrate, a second source/drain region in the semiconductor substrate, and a first gate structure over the semiconductor substrate;
    a second pull-up transistor comprising a second gate structure, the second gate structure having a first top surface and a second top surface, the first top surface being disposed further from the semiconductor substrate than the second top surface;
    a first contact over the first source/drain region, the first contact physically contacting the first source/drain region, the first contact physically contacting a portion of the semiconductor substrate between the first source/drain region and the second gate structure, the first contact extending into a side of the second gate structure, the first contact physically contacting the second top surface of the second gate structure;
    a second contact over the second source/drain region, the second contact physically contacting the second source/drain region, the second contact separated from a side of the first gate structure;
    a first dielectric layer over the first gate structure, the second gate structure, the first contact, and the second contact; and
    a via extending through the first dielectric layer to contact the second contact, the via separated from the first contact.

12. The device of claim 11, wherein the first contact has an upper width and a lower width, the upper width being greater than the lower width.

13. The device of claim 11, wherein the first dielectric layer completely covers a top surface of the first contact.

14. The device of claim 11, wherein the second pull-up transistor further comprises a third source/drain region and a fourth source/drain region, and the device further comprises:
    a third contact over the third source/drain region, the third contact physically contacting the third source/drain region and extending into a second side of the first gate structure.

15. The device of claim 14 further comprising:
a first spacer separating the first contact from the second side of the first gate structure; and
a second spacer separating the third contact from the side of the second gate structure.

16. The device of claim 15, wherein top surfaces of the first spacer, the second spacer, the first contact, and the second contact are coplanar.

17. The device of claim 11, wherein the first contact extends along an entirety of a sidewall of the second gate structure.

18. The device of claim 11, wherein a top surface of the first contact is disposed further from the semiconductor substrate than the first top surface of the second gate structure.

19. The device of claim 11 further comprising:
a first dielectric cap on the first gate structure; and
a second dielectric cap on the second gate structure.

20. The device of claim 19, wherein a top surface of the first contact is coplanar with a top surface of the second dielectric cap.

* * * * *